United States Patent [19]

Hanaoka

[11] Patent Number: 5,545,925
[45] Date of Patent: Aug. 13, 1996

[54] SEMICONDUCTOR DEVICE HAVING A METALLIC SILICIDE LAYER FOR IMPROVED OPERATIONAL RATES

[75] Inventor: Katsunari Hanaoka, Ono, Japan

[73] Assignees: Ricoh Co., Ltd., Tokyo; Ricoh Research Institute of General Electronics Co., Ltd., Natori, both of Japan

[21] Appl. No.: 264,447

[22] Filed: Jun. 23, 1994

[30] Foreign Application Priority Data

Apr. 19, 1993 [JP] Japan ................................. 6-104438
Jun. 25, 1993 [JP] Japan ................................. 5-180024

[51] Int. Cl.$^6$ ............................. H01L 23/48; H01L 23/52; H01L 29/40
[52] U.S. Cl. ............................. 257/755; 257/768; 257/754
[58] Field of Search ................................ 257/754, 755, 257/768

[56] References Cited

U.S. PATENT DOCUMENTS

| 4,860,086 | 8/1989 | Nakamura et al. | 257/755 |
|---|---|---|---|
| 4,916,397 | 4/1990 | Masuda et al. | 257/754 |
| 4,974,046 | 11/1990 | Vora | 257/754 |
| 5,012,320 | 4/1991 | Yamazaki | 257/755 |
| 5,221,853 | 6/1993 | Joshi et al. | 257/755 |
| 5,336,911 | 8/1994 | Furuhata et al. | 257/754 |

*Primary Examiner*—Sara W. Crane
*Assistant Examiner*—S. V. Clark
*Attorney, Agent, or Firm*—Cooper & Dunham LLP

[57] ABSTRACT

A polycrystal silicon electrode and a side wall are formed in a method for manufacturing a semiconductor device. Thereafter, air is exhausted from a film forming chamber until a vacuum degree of $4\times10^{-8}$ Torr. A mixing gas of $N_2$ and argon (At) is introduced into this chamber with 60 sccm and a pressure within the chamber is set to 2.0 mTorr. A percentage of $N_2$ to argon (Ar) in this mixing gas atmosphere is set to 10%. Direct current power 6 kW is applied to a titanium target having 99.998% in purity and 12 inches in length so that the titanium target is sputtered and formed as a titanium film including nitrogen. The titanium film is processed rapidly and thermally for 30 seconds at a temperature of 750 ° C. by using a xenon (Xe) arc lamp. Thus, a silicide film is uniformly formed selectively on a silicon substrate and the polycrystal silicon electrode. In this manufacturing method, it is possible to prevent agglomeration of the silicide film at a high temperature processing time after the silicide film is formed.

4 Claims, 8 Drawing Sheets

SEMICONDUCTOR DEVICE HAVING A METALLIC SILICIDE LAYER FOR IMPROVED OPERATIONAL RATES

BACKGROUND OF THE INVENTION

1. Field of the Invention

The present invention relates to a semiconductor device including a large scale integrated circuit and a method for manufacturing the semiconductor device. More particularly, the present invention relates to a semiconductor device and a manufacturing method thereof characterized in a contact portion between a substrate and a metallic wiring layer and in formation of a gate electrode as a silicide.

2. Description of the Related Art

As a semiconductor integrated circuit is large-sized and wiring patterns of this semiconductor integrated circuit are finely formed, a method for forming a silicide is used to reduce contact resistances between a substrate and metallic wirings and resistances of the wirings and a gate electrode so as to operate the semiconductor integrated circuit at a high speed.

Figure 1A:
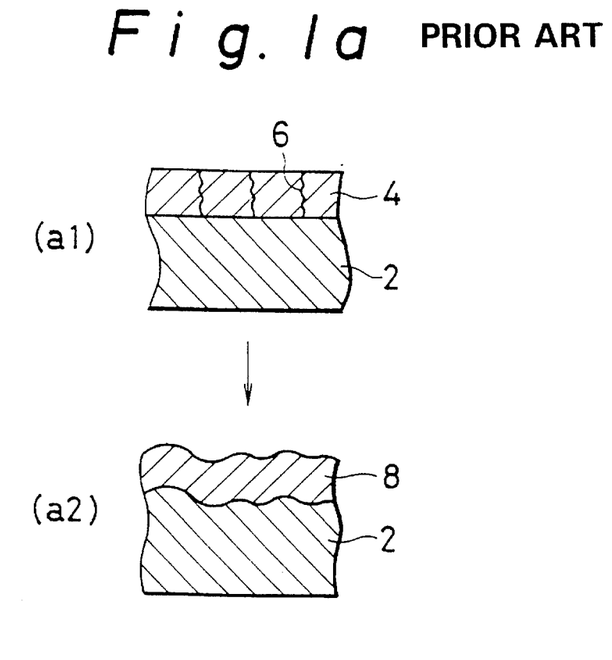
FIG. 1a is a cross-sectional view schematically showing a main portion of a general silicide forming process.

In silicide formation, a high melting point metallic polycrystal film of titanium, etc. is formed on an exposed portion of a silicon substrate and a polycrystal silicon wiring by using a sputtering method. This polycrystal film is rapidly processed thermally in a nitrogen atmosphere. Thus, portions of the metallic polycrystal film coming in contact with the exposed portion of the silicon substrate and the polycrystal silicon film are formed as a silicide. FIG. 1a shows general silicide forming processes. In FIG. 1a, a polycrystal titanium film 4 is formed on a silicon substrate 2 by a sputtering method. A normal sputtering method for forming the titanium film 4 is a DC sputtering method. In the DC sputtering method, a target voltage is set to −400 to −600 V and a substrate voltage is set to −10 to −100 V with respect to a film forming chamber having a ground potential. A sputtering atmosphere is formed by argon (Ar) gas. As shown by process (a1) of FIG. 1a, a crystal grain boundary 6 exists in the polycrystal titanium film 4. A silicide is formed by processing this polycrystal titanium film 4 rapidly and thermally. In this case, a silicide is preferentially formed from an unstable portion of the grain boundary 6 so that a silicide film 8 is ununiformly formed as shown by process (a2) of FIG. 1a. In a serious case, in the rapid thermal processing for the silicide film formation, a discontinuous silicide layer locally having no silicide layer is formed in a portion in which the silicide film should be formed on a diffusive layer and a gate electrode. The crystal grain boundary of the silicide film is formed in a wide range of a size from several hundred nm to several μm.

When the discontinuous silicide film is formed on surfaces of the diffusive layer and the gate electrode, sheet resistance of the silicide film is increased. When the crystal grain boundary is formed in the wide range from several hundred nm to several μm, sheet resistance of a gate electrode becomes ununiform when the gate electrode is formed as an electrode having a narrow width such as a width equal to or smaller than 1 μm.

In the ununiform silicide film, agglomeration is caused in a heat treatment process at a subsequent forming time of a layer-insulation film, etc. Therefore, one method for preventing agglomeration of the silicide film is proposed in IEEE, 1990, VMIC Conf., pp. 310–316, etc. In this method, a polycrystal titanium film is formed on an exposed portion of a silicon substrate and a polycrystal silicon film. Thereafter, nitrogen ions are implanted into the polycrystal titanium film. Then, the polycrystal titanium film is thermally processed to form a silicide.

However, in this method, an operation rate of the manufacturing device is reduced by adding an ion implanting process.

SUMMARY OF THE INVENTION

It is therefore a first object of the present invention to provide a semiconductor device having a metallic silicide layer having a small sheet resistance.

A second object of the present invention is to provide a manufacturing method of a semiconductor device for forming a silicide film having an excellent heat resisting property in which no ion implanting process is included in a silicide forming process so that a reduction in operation rate of the semiconductor device is prevented and agglomeration of the silicide film is prevented at a high temperature processing time after the silicide film is formed.

The above first object of the present invention can be achieved by a semiconductor device comprising a monocrystal silicon substrate having an exposed portion; a patterned polycrystal silicon film formed on the monocrystal silicon substrate through an insulating film; and a metallic silicide film formed as a continuous thin film on at least one of the exposed portion of the monocrystal silicon substrate and the polycrystal silicon film.

An average value of the diameter of a crystal particle in the metallic silicide film is preferably equal to or greater than 0.5 μm and is preferably less than 1.5 μm.

Further, 80% or more of all crystal particle diameters of the metallic silicide film is preferably occupied by crystal particle diameters which are equal to or greater than 0.5 μm and are less than 1.5 μm.

The above second object of the present invention can be achieved by a method for manufacturing a semiconductor device in which the semiconductor device comprises a monocrystal silicon substrate having an exposed portion; a patterned polycrystal silicon film formed on the monocrystal silicon substrate through an insulating film; and a base having at least one of the exposed portion of the monocrystal silicon substrate and the polycrystal silicon film; the manufacturing method comprising the steps of a process for forming an amorphous high melting point metallic film on the base; and a process for selectively forming a metallic silicide film by thermal processing on the exposed portion of the monocrystal silicon, substrate and the polycrystal silicon film after the amorphous high melting point metallic film is formed.

The amorphous high melting point metallic film is preferably constructed by a titanium film formed by holding a substrate potential at a negative high voltage with respect to the potential of a film forming chamber in a sputtering method.

Otherwise, the amorphous high melting point metallic film is preferably constructed by a titanium film formed by including nitrogen in a sputtering atmosphere and controlling a partial pressure of this nitrogen in a sputtering method.

The above second object of the present invention can be also achieved by a method for manufacturing a semiconductor device in which the semiconductor device comprises a monocrystal silicon substrate having an exposed portion; a patterned polycrystal silicon film formed on the monocrystal silicon substrate through an insulating film; and a base having at least one of the exposed portion of the monocrystal silicon substrate and the polycrystal silicon film; the manufacturing method comprising the steps of a process for forming a polycrystal high melting point metallic film including nitrogen on the base by including nitrogen in a sputtering atmosphere and controlling a partial pressure of this nitrogen by a sputtering method; and a process for selectively forming a metallic silicide film by thermal processing on the exposed portion of the monocrystal silicon substrate and the polycrystal silicon film after the polycrystal high melting point metallic film is formed.

In the present invention, the semiconductor device has a metallic silicide layer having a small sheet resistance.

In the manufacturing method of the semiconductor device in the present invention, no ion implanting process is included in a silicide forming process. Accordingly, a reduction in operation rate of the semiconductor device is prevented and agglomeration of the silicide film is prevented at a high temperature processing time after the silicide film is formed. Therefore, the silicide film has an excellent heat resisting property.

Further objects and advantages of the present invention will be apparent from the following description of the preferred embodiments of the present invention as illustrated in the accompanying drawings.

BRIEF DESCRIPTION OF THE DRAWINGS

each of FIGS. 1b and 1c is a cross-sectional view schematically showing a main portion of a silicide forming process of the present invention.

DESCRIPTION OF THE PREFERRED EMBODIMENTS

The preferred embodiments of a semiconductor device and a manufacturing method thereof in the present invention will next be described in detail with reference to the accompanying drawings.

Figure 1B:
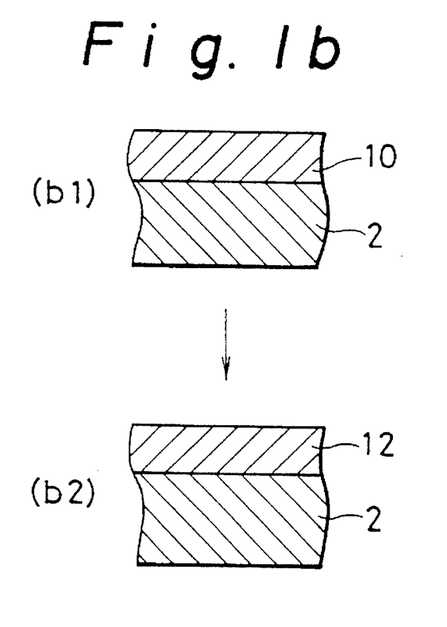

FIG. 1b shows a method for preventing agglomeration of a silicide film by forming a high melting point metallic film such as a titanium film in an amorphous state. As shown by process (b1) of FIG. 1b, an amorphous high melting point metallic film 10 can be formed on a silicon substrate 2 by controlling a manufacturing condition at a sputtering time. A DC sputtering method is one example of this manufacturing method. In the DC sputtering method, a target potential is held at a value from −400 to −600 V with respect to the potential of a film forming chamber in sputtering. A substrate potential is held at a negative high voltage such as −500 V with respect to the potential of the film forming chamber. In another amorphous manufacturing method, nitrogen having a predetermined partial pressure is included in a sputtering atmosphere in a normal DC sputtering condition. As shown by process (b2) of FIG. 1b, a uniform silicide film 12 can be formed by rapidly and thermally processing the amorphous metallic film 10 having no grain boundary to form a silicide.

Figure 1C:
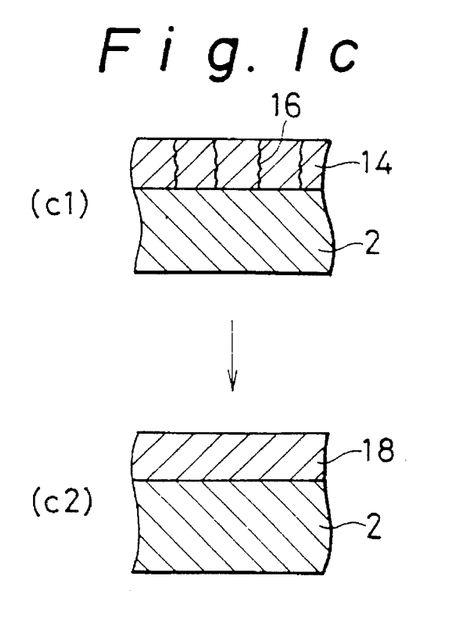

FIG. 1c shows a method for preventing agglomeration of a silicide film by forming a high melting point metallic film such as a titanium film in a polycrystal state including nitrogen. As shown by process (c1) of FIG. 1c, a polycrystal high melting point metallic film 14 is formed on a silicon substrate 2. This polycrystal high melting point metallic film 14 is constructed by a titanium film including nitrogen, etc. in which concentration of nitrogen atoms is high in a grain boundary portion. Such a polycrystal high melting point metallic film 14 can be formed by including nitrogen gas in a sputtering atmosphere at a predetermined partial pressure at a DC sputtering time in a normal manufacturing condition. As shown by process (c2) of FIG. 1c, a uniform silicide film 18 can be obtained by rapidly and thermally processing this high melting point metallic film 14 including nitrogen. This is probably because a coupling portion of a nitrogen atom and a high melting point metallic atom exists in a grain boundary 18 so that the height of a diffusive barrier is increased in a grain boundary portion. Namely, this is probably because the grain boundary is blocked by nitrogen so that no silicide is preferentially formed from the grain boundary.

No agglomeration of each of the uniform silicide films 12 and 18 is easily caused at a high temperature processing time so that each of the uniform silicide films has an excellent heat resisting property.

Substrate potential effects and nitrogen partial pressure effects in an atmosphere will next be explained when a titanium film is formed by a sputtering method with reference to FIGS. 2a and 2b.

Figure 2A:
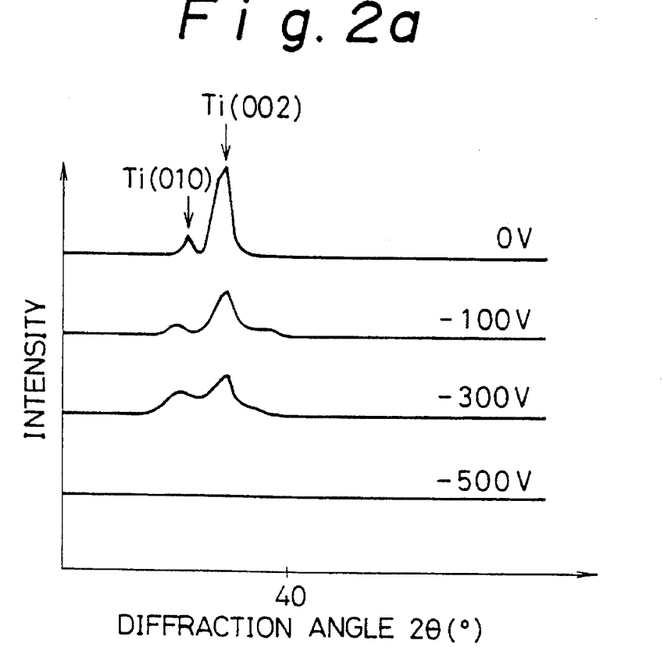
FIG. 2a is a graph showing a change in crystal state of a titanium film in a sputtering condition and shows effects of a substrate potential.

FIG. 2a shows an X-ray diffraction spectrum of a titanium film formed when a substrate potential is changed with respect to the potential of a film forming chamber. A target potential is set to −450 V with respect to the potential of the film forming chamber. Air is exhausted from the chamber until a vacuum degree of $4\times10^{-8}$ Torr. Argon (Ar) gas is introduced into this chamber with 60 sccm and a pressure within the chamber is set to 2.0 mTorr. Direct current power 6 kW is then applied to a titanium target having 99.998% in purity and 12 inches in length so that the titanium target is sputtered and formed as a titanium film. At this time, crystal orientation of the obtained titanium film is changed by variously changing a negative voltage applied to the substrate. (010) and (002) crystal faces of titanium (Ti) are seen when the substrate potential is ranged from 0 to −300 V.

Accordingly, it is understood that these crystal faces show a polycrystal state. In contrast to this, no crystal face is seen when the substrate potential is equal to −500 V. Accordingly, it is understood that the obtained titanium film is an amorphous film.

Figure 2B:
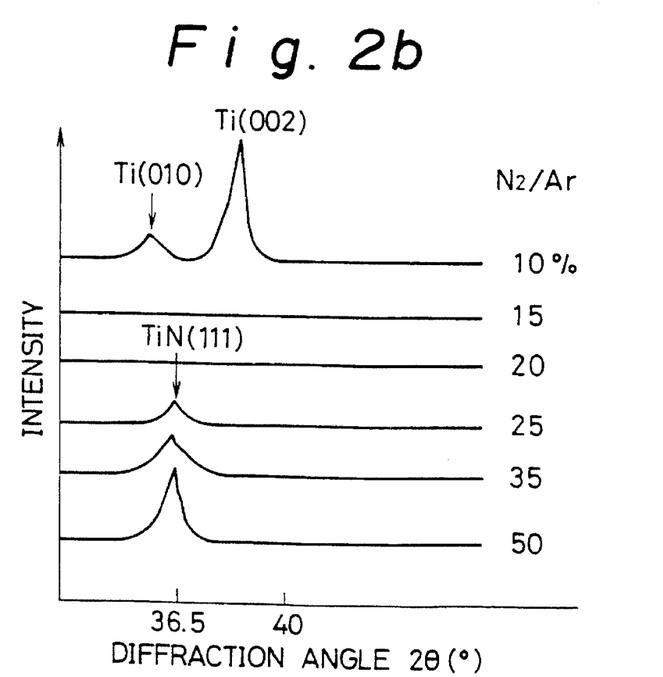
FIG. 2b is a graph showing a change in crystal state of a titanium film in a sputtering condition and shows effects of a partial pressure of nitrogen gas in a sputtering atmosphere.

FIG. 2b shows an X-ray diffraction spectrum of a titanium film formed by changing a partial pressure of nitrogen gas in an atmosphere. Air is exhausted from the chamber until a vacuum degree of $4\times10^{-8}$ Torr. A mixing gas of $N_2$ and argon (Ar) is introduced into this chamber with 60 sccm and a pressure within the chamber is set to 2.0 mTorr. Direct current power 5 kW is then applied to a titanium target having 99.998% in purity and 12 inches in length so that the titanium target is sputtered and formed as a titanium film. The substrate potential is set to −14 V and the target potential is set to −450 V with respect to the potential of the film forming chamber. A percentage of $N_2$ to argon (Ar) in the mixing gas atmosphere is changed in a range from 10 to 50%. When the percentage of nitrogen is equal to 10%, a polycrystal titanium film is formed. When the percentage of nitrogen is ranged from 15 to 20%, an amorphous titanium film is formed. When the percentage of nitrogen is ranged from 25 to 50%, a polycrystal TiN film is formed.

Embodiment 1

A method for manufacturing a semiconductor device in accordance with a first embodiment of the present invention will next be explained with reference to FIGS. 3a to 3f.

Figure 3A:
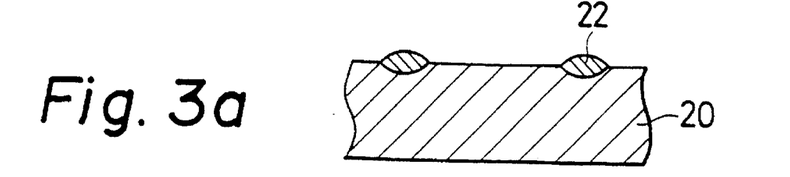
FIGS. 3a to 3f are cross-sectional views showing processes for forming a silicide film in a manufacturing method of a semiconductor device in accordance with one embodiment of the present invention.

(A) An element separating region is formed on a substrate 20 of monocrystal silicon (100) by a well-known selective oxidizing method (a LOCOS method).

Figure 3B:
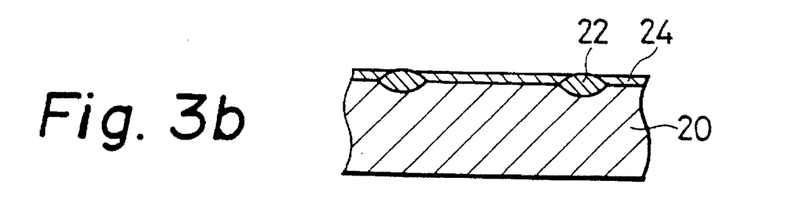

(B) A silicon oxide film 24 is formed on an exposed portion of the silicon substrate 20 by a thermal oxidizing method such that the silicon oxide film 24 has about 150Å in thickness.

Figure 3C:
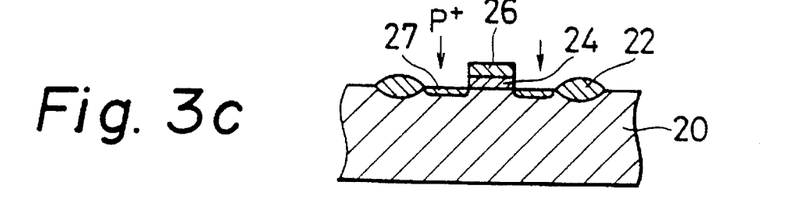

(C) A polycrystal silicon film 26 is formed on the silicon oxide film 24 by a CVD method. A resist pattern is then formed by a photolithography method. The polycrystal silicon film 26 and the silicon oxide film 24 are patterned by a dry etching method with the resist pattern as a mask so that a polycrystal silicon electrode is formed.

Phosphorus ions are then implanted into the silicon substrate 20 with the polycrystal silicon electrode and a field oxide film 22 as masks so that a low concentration diffusive $N^-$ layer 27 having a lightly doped drain (LDD) structure is formed. In an ion implanting condition, implanting energy is set to 10 to 60 KeV. For example, the implanting energy is set to 30 KeV. A dosing amount is set to $1\times10^{12}$ to $1\times10^{14}/cm^2$. For example, the dosing amount is set to $2\times10^{13}/cm^2$.

Figure 3D:
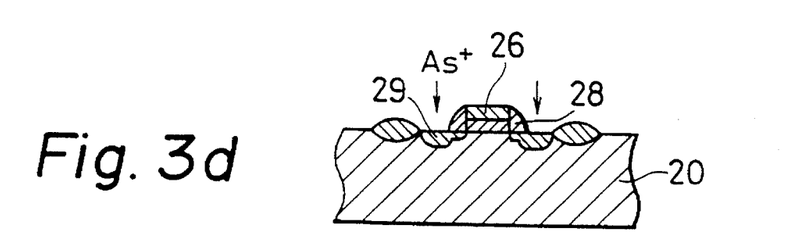

(D) A silicon oxide film is formed by the CVD method and is etched back until the silicon substrate 20 is exposed. Thus, a side wall 28 is formed on a side face of the polycrystal silicon electrode.

Arsenic ions are implanted into the silicon substrate 20 with the polycrystal silicon electrode, the side wall 28 and the field oxide film 22 as masks. Thus, a high concentration diffusive $N^+$ layer 29 having an LDD structure is formed as a source-drain region. In an ion implanting condition, implanting energy is set to 10 to 60 KeV. For example, the implanting energy is set to 50 KeV. A dosing amount is set to $1\times10^{15}$ to $1\times10^{16}/cm^2$. For example, the dosing amount is set to $6\times10^{15}/cm^2$.

Figure 3E:
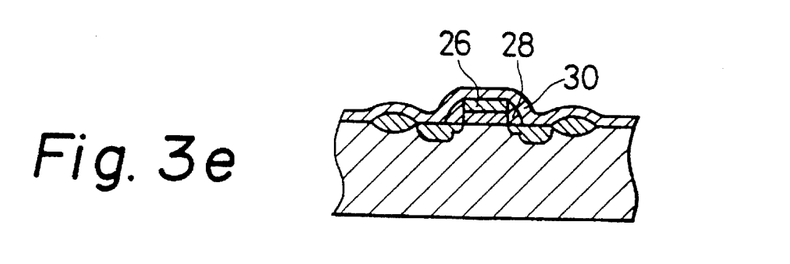

(E) Air is exhausted from the chamber until a vacuum degree of $4\times10^{-8}$ Torr. Argon (Ar) gas is introduced into this chamber with 60 sccm and a pressure within the chamber is set to 2.0 mTorr. Direct current power 6 kW is then applied to a titanium target having 99.998% in purity and 12 inches in length so that DC sputtering is performed with respect to the titanium target. At this time, a substrate potential is set to −500 V and a target potential is set to −450 V with respect to a potential of the film forming chamber so that an amorphous titanium film 30 is formed.

Figure 3F:
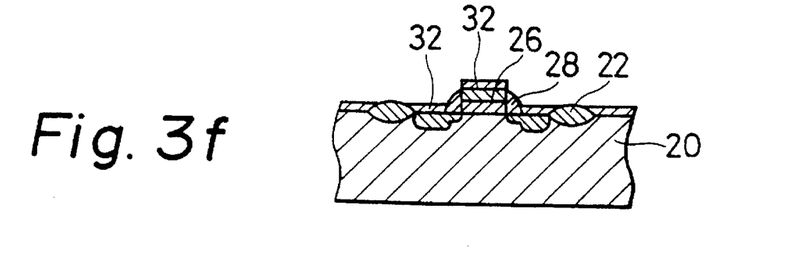

(F) The amorphous titanium film 30 is then processed rapidly and thermally for 30 seconds at a temperature of 750° C. by using a xenon (Xe) arc lamp. Thus, a silicide film 32 is selectively formed on the silicon substrate 20 and the polycrystal silicon electrode. Thereafter, titanium not reacting on the element separating region 22 and the side wall 28 is removed therefrom by a mixing liquid of ammonium hydroxide and hydrogen peroxide water.

The silicide film 32 is formed by forming the amorphous titanium film 30 as a silicide and is formed as a uniform silicide.

Figure 4:
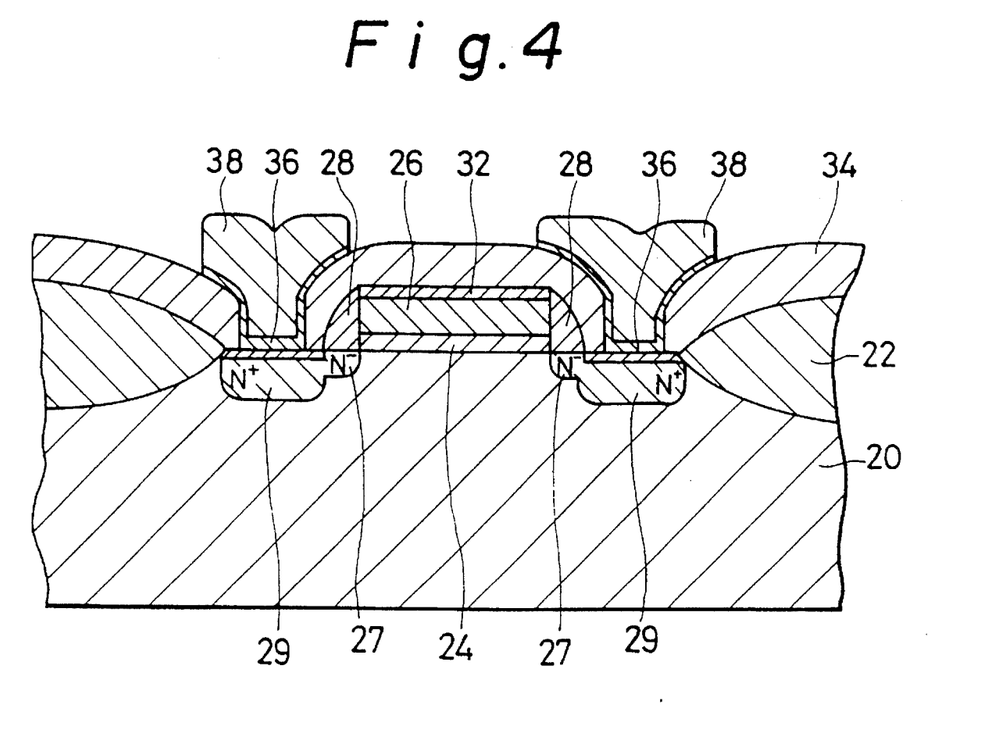
FIG. 4 is a cross-sectional view showing a MOSFET in one embodiment of the present invention.

FIG. 4 shows one example of a MOSFET of the LDD structure having the silicide film 32 formed above. A uniform and continuous thin silicide film 32 is formed on a substrate surface in a source-drain region between a field oxide film 22 and a side wall 28 and is also formed on a polycrystal silicon electrode 26. Reference numeral 34 designates a layer insulation film such as a PSG film, a BPSG film, etc. In a contact hole of this layer insulation film 34, a metallic wiring 38 including aluminum is connected to a source-drain diffusive layer 29 through a barrier layer 36 and a titanium silicide layer 32. The barrier layer 36 is constructed by a high melting point metallic alloy film of TiW, etc. or a high melting point metallic compound film of TiN, etc.

Embodiment 2

A sputtering condition in a process for forming a titanium film in the second embodiment is different from that in the first embodiment. In this second embodiment, air is exhausted from the chamber until a vacuum degree of $4\times10^{-8}$ Torr. A mixing gas of $N_2$ and argon (Ar) is introduced into this chamber with 60 sccm and a pressure within the chamber is set to 2.0 mTorr. A percentage of $N_2$ to argon (Ar) in this mixing gas atmosphere is set to 15%. A substrate potential is set to −14 V and a target potential is set to −450 V with respect to a potential of the film forming chamber. Direct current power 5 kW is then applied to a titanium target having 99.998% in purity and 12 inches in length so that DC sputtering is performed with respect to the titanium target.

An obtained titanium film is formed as an amorphous titanium film and has no grain boundary. Similar to the first embodiment, the amorphous titanium film is processed rapidly and thermally for 30 seconds at a temperature of 750° C. by using a xenon (Xe) arc lamp. Thus, a silicide film is uniformly formed selectively on the silicon substrate and a polycrystal silicon electrode.

Embodiment 3

A sputtering condition in a process for forming a titanium film in the third embodiment is different from that in the first embodiment. In this third embodiment, air is exhausted from the chamber until a vacuum degree of $4\times10^{-8}$ Torr. A mixing gas of $N_2$ and argon (Ar) is introduced into this chamber with 60 sccm and a pressure within the chamber is set to 2.0 mTorr. A percentage of $N_2$ to argon (Ar) in this mixing gas atmosphere is set to 10%. A substrate potential is set to –14 V and a target potential is set to –450 V with respect to a potential of the film forming chamber. Direct current power 5 kW is then applied to a titanium target having 99.998% in purity and 12 inches in length so that DC sputtering is performed with respect to the titanium target. A titanium film formed in this condition is obtained as a polycrystal titanium film.

In a rapid heat treating process of this polycrystal titanium film, no silicide is preferentially formed in a grain boundary portion so that a uniform silicide film is formed.

Figure 5:
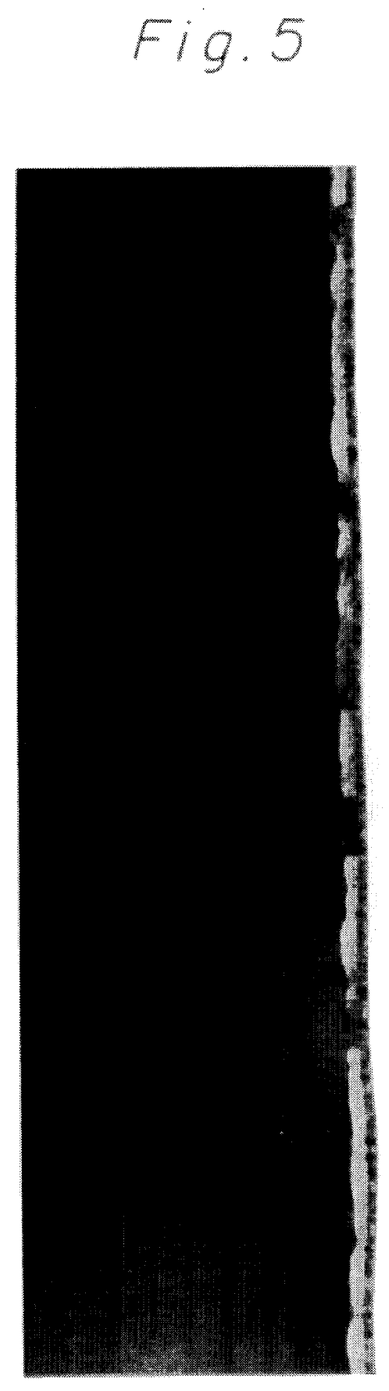
FIG. 5 is a sectional transmitting photograph of an electron microscope in which a sample having a silicide layer formed by the manufacturing method in one embodiment of the present invention is shown at a magnification of 100,000 times.
Figure 6:
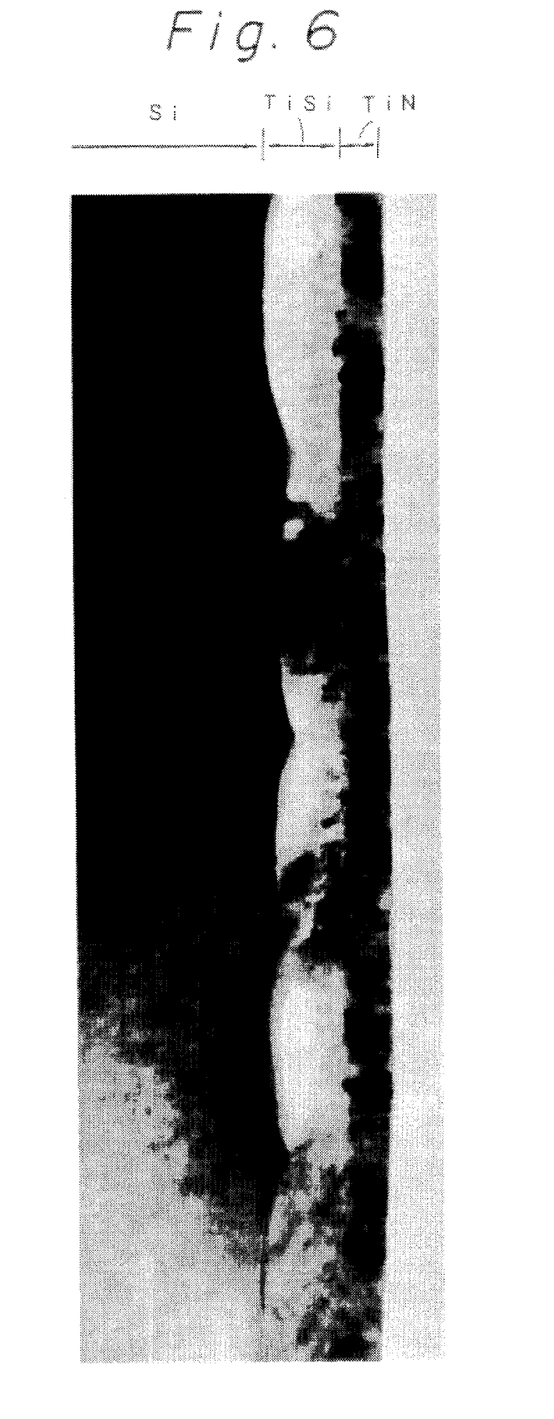
FIG. 6 is a sectional transmitting photograph of an electron microscope in which a sample having a silicide layer formed by the manufacturing method in the same embodiment as FIG. 5 is shown at a magnification of 500,000 times.

Each of FIGS. 5 and 6 illustrates a sectional transmitting photograph of an electron microscope showing a sample having a silicide layer formed by heating a lamp after a titanium film is formed on a monocrystal substrate in the manufacturing condition described in the Embodiment 3. Magnifications of the microscope in FIGS. 5 and 6 are respectively set to 100,000 times and 500,000 times.

A titanium layer (TIN) including nitrogen is formed on a surface of a silicon substrate such that this TiN layer has about 200Å in thickness. A titanium silicide (TiSi) layer having 150 to 350 Å in thickness is formed on an interface between this TiN layer and the silicon substrate. The titanium silicide layer is a thin film continuously formed on an entire surface of the substrate. It should be understood from the photograph of FIG. 6 that the width of a distribution of the size of a crystal particle is narrow.

No silicide is preferentially formed in a grain boundary portion of the silicide film obtained in each of the Embodiments 1 to 3 so that the silicide film is uniform. Therefore, no agglomeration of the silicide film is caused in thermal processing at a high temperature such as a temperature equal to or higher than 850° C. in a reflow process of a PBSG layer insulation film as a subsequent process. Accordingly, it is possible to stably construct a low resistance diffusive layer and a low resistance gate electrode.

COMPARISON EXAMPLE

A sputtering condition in a process for forming a titanium film in the comparison example is different from that in each of the above Embodiments. A polycrystal titanium film including no nitrogen is formed in the sputtering condition in the comparison example. In this sputtering condition, air is exhausted from the chamber until a vacuum degree of $4 \times 10^{-8}$ Torr. Argon (Ar) gas is introduced into this chamber with 60 sccm and a pressure within the chamber is set to 2.0 mTorr. A substrate potential is set to –14 V and a target potential is set to –450 V with respect to a potential of the film forming chamber. Direct current power 6 kW is then applied to a titanium target having 99.998% in purity and 12 inches in length so that DC sputtering is performed with respect to the titanium target. A titanium film formed in this condition is a polycrystal titanium film.

A silicide is preferentially formed in a grain boundary portion of the titanium film formed in the comparison example at a heat treating time for forming the silicide so that a silicide film is ununiformly formed. This ununiform silicide film causes agglomeration by thermal processing at a temperature of 850° C. in a reflow process of a layer insulation film as a subsequent process. Accordingly, sheet resistances of a diffusive layer and a gate electrode are increased.

Figure 7:
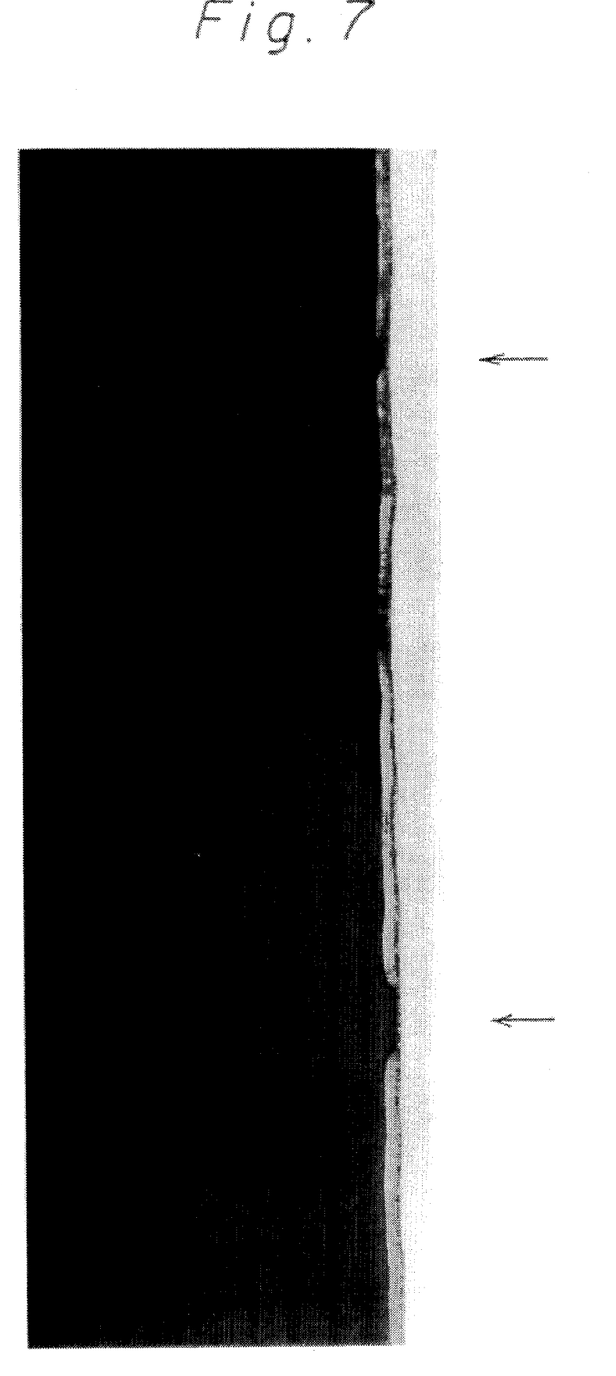
FIG. 7 is a sectional transmitting photograph of an electron microscope in which a sample having a silicide layer formed by a manufacturing method in a comparison example is shown at a magnification of 100,000 times.
Figure 8:
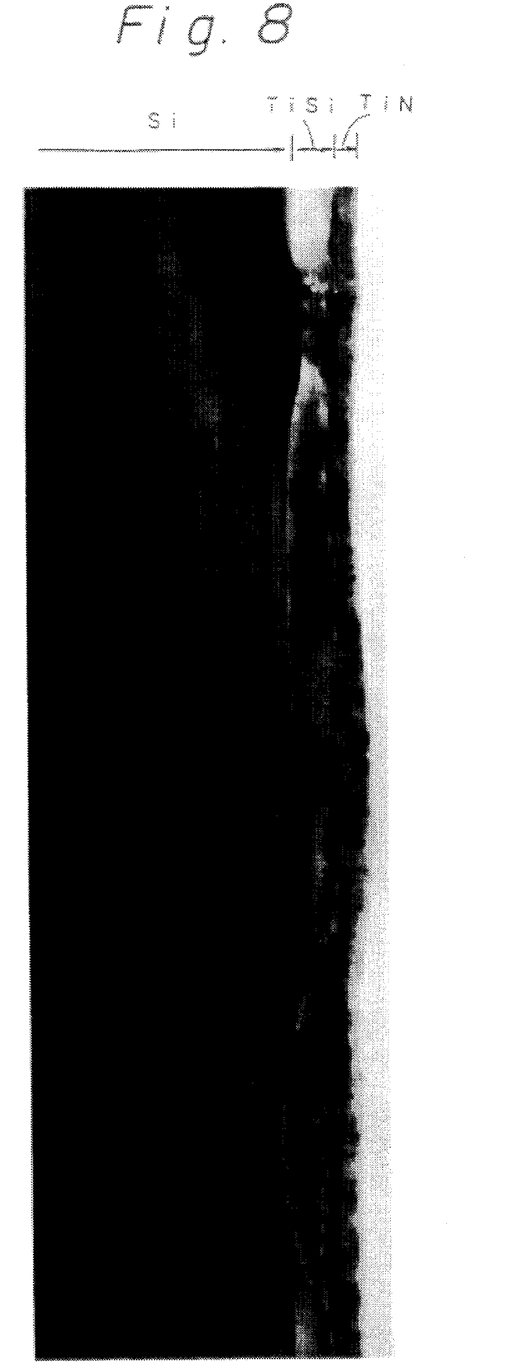
FIG. 8 is a sectional transmitting photograph of an electron microscope in which a sample having a silicide layer formed by the manufacturing method in the same comparison example is shown at a magnification of 500,000 times.

Each of FIGS. 7 and 8 illustrates a sectional transmitting photograph of an electron microscope showing a sample having a silicide layer formed by heating a lamp after a titanium film is formed on a monocrystal substrate in the sputtering condition in the comparison example. Magnifications of the microscope in FIGS. 7 and 8 are respectively set to 100,000 and 500,000. As can be seen from FIG. 7, no silicide film is formed in a position shown by each of arrows in this condition. As can be seen from the enlarged photograph of FIG. 8, the size of a crystal particle in the silicide film is ununiform and its distribution width is wide. The thickness of a TiN film is about 100Å and the thickness of a TiSi film is about 200Å.

The following Tables 1 and 2 respectively show distributions of particle diameters of the titanium silicide film formed in the Embodiment 3 and the titanium silicide film formed in the comparison example.

TABLE 1

| particle diameter (μm) | less than 0.5 | 0.5 or more less than 0.75 | 0.75 or more less than 1.0 | 1.0 or more less than 1.25 | 1.25 or more less than 1.5 | 1.5 or more |
|---|---|---|---|---|---|---|
| distribution frequency (%) | 5 | 10 | 40 | 30 | 10 | 5 |

TABLE 2

| particle diameter (μm) | less than 0.5 | 0.5 or more less than 0.75 | 0.75 or more less than 1.0 | 1.0 or more less than 1.25 | 1.25 or more less than 1.5 | 1.5 or more |
|---|---|---|---|---|---|---|
| distribution frequency (%) | 50 | 2 | 2 | 6 | 10 | 30 |

As can be seen from the particle diameter distribution in the Table 1, 90% of all particle diameters is occupied by particle diameters which are equal to or greater than 0.5 μm and are less than 1.5 μm. In contrast to this, in the comparison example shown in the Table 2, 50% of all particle diameters is occupied by particle diameters less than 0.5 μm and 30% of all particle diameters is occupied by particle diameters equal to or greater than 1.5 μm.

The following Table 3 shows sheet resistance values of a BPSG layer insulation film of a gate electrode (polycide electrode) having a laminating structure of a silicide diffusive layer, polycrystal silicon and a silicide having 0.5 μm in width, which are formed in the Embodiments 1 to 3 and the comparison example. The sheet resistance values are provided after a reflow process of the BPSG layer insulation film. The Table 3 also shows contact resistance values in a contact hole having a contact diameter of 0.5 μm and formed on the silicide diffusive layer. As can be seen from these resistance results, each of the resistance values is greatly increased in the comparison example.

TABLE 3

| | | Embodiment 1 | Embodiment 2 | Embodiment 3 | Comparison example |
|---|---|---|---|---|---|
| contact resistance (contact diameter 0.5 μm) | on n-type | 20Ω | 20Ω | 20Ω | 40Ω |
| | on p-type | 40Ω | 40Ω | 40Ω | 100Ω |
| sheet | n- | 3.5Ω/□ | 4.1Ω/□ | 4.0Ω/□ | 250Ω/□ |

TABLE 3-continued

| | type | Embodiment 1 | Embodiment 2 | Embodiment 3 | Comparison example |
|---|---|---|---|---|---|
| resistance of diffusive layer | p-type | 3.5Ω/□ | 4.1Ω/□ | 4.0Ω/□ | 280Ω/□ |
| sheet resistance of 0.5 μm polycide gate | n-type | 2.8Ω/□ | 3.0Ω/□ | 3.0Ω/□ | 180Ω/□ |
| | p-type | 2.8Ω/□ | 3.0Ω/□ | 3.0Ω/□ | 200Ω/□ |

In the Embodiments 1 to 3, a source and a drain are set to those of a MOSFET having an LDD structure as one example. However, the present invention is not limited to the LDD structure, but can be applied to a MOSFET having a single drain or a MOSFET having a source and a drain in another structure different from the LDD structure.

In the present invention, a process for forming a high melting point metallic film is provided to form a silicide by a sputtering method. An amorphous high melting point metallic film or a grain boundary is blocked by nitrogen by controlling a sputtering condition in this process so that a polycrystal high melting point metallic film is formed. Thus, the silicide is uniformly formed later. Accordingly, no agglomeration is caused in high temperature thermal processing in a subsequent process so that a silicide film having an excellent heat resisting property can be formed.

Sheet resistance of the silicide film formed by the manufacturing method of the semiconductor device in the present invention is small and the silicide film has an excellent heat resisting property.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor device comprising:

a monocrystal silicon substrate having an exposed circuit forming surface;

a polycrystal silicon film formed on a portion of the exposed circuit forming surface of the monocrystal silicon substrate through an insulating film; and a metallic silicide film formed as a continuous thin film on at least a portion of a remaining portion of the exposed circuit forming surface of the monocrystal silicon substrate and the polycrystal silicon film;

wherein an average value of the diameter of a crystal particle in the metallic silicide film is equal to or greater than 0.5 μm and is less than 1.5 μm.

2. A semiconductor device as claimed in claim 1, wherein 80% or more of all crystal particle diameters of the metallic silicide film is occupied by crystal particle diameters which are equal to or greater than 0.5 μm and are less than 1.5 μm.

3. A semiconductor device comprising:

a monocrystal silicon substrate having an exposed circuit forming surface;

a patterned polycrystal silicon film formed on a portion of the exposed circuit forming surface of said monocrystal silicon substrate through an insulating film; and a titanium film formed as a continuous thin film on at least a portion of a remaining portion of said exposed circuit forming surface of the monocrystal silicon substrate and the polycrystal silicon film;

wherein an average value of the diameter of a crystal particle in said titanium film is equal to or greater than 0.5 μm and is less than 1.5 μm.

4. A semiconductor device as claimed in claim 3, wherein 80% or more of all crystal particle diameters of the titanium film is occupied by crystal particle diameters which are equal to or greater than 0.5 μm and are less than 1.5 μm.

* * * * *

UNITED STATES PATENT AND TRADEMARK OFFICE
CERTIFICATE OF CORRECTION

PATENT NO. : 5,545,925
DATED : August 13, 1996
INVENTOR(S) : Katsunari HANAOKA

It is certified that error appears in the above-identified patent and that said Letters Patent is hereby corrected as shown below:

Title page, item [30], please delete "Apr. 19, 1993" and insert

--Apr. 19, 1994--.

Signed and Sealed this

Fourth Day of February, 1997

Attest:

BRUCE LEHMAN

Attesting Officer

Commissioner of Patents and Trademarks